US011662524B2

United States Patent
Kurunczi et al.

(10) Patent No.: US 11,662,524 B2
(45) Date of Patent: *May 30, 2023

(54) FORMING VARIABLE DEPTH STRUCTURES WITH LASER ABLATION

(71) Applicant: Applied Materials, Inc., Santa Clara, CA (US)

(72) Inventors: Peter Kurunczi, Winchester, MA (US); Joseph Olson, Beverly, MA (US); Morgan Evans, Manchester, MA (US); Rutger Meyer Timmerman Thijssen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 320 days.

This patent is subject to a terminal disclaimer.

(21) Appl. No.: 16/818,457

(22) Filed: Mar. 13, 2020

(65) Prior Publication Data

US 2021/0286132 A1   Sep. 16, 2021

(51) Int. Cl.
| | | |
|---|---|---|
| *G02B 6/34* | (2006.01) | |
| *G03F 7/09* | (2006.01) | |
| *G03F 7/00* | (2006.01) | |
| *B29C 33/38* | (2006.01) | |

(52) U.S. Cl.
CPC .............. *G02B 6/34* (2013.01); *G03F 7/0005* (2013.01); *G03F 7/094* (2013.01); *B29C 33/3842* (2013.01); *G02B 2207/101* (2013.01); *G03F 7/0002* (2013.01)

(58) Field of Classification Search
CPC .................. G02B 2207/101; B29C 33/3842
See application file for complete search history.

(56) References Cited

U.S. PATENT DOCUMENTS

| 6,545,808 | B1 * | 4/2003 | Ehbets ............... G02B 6/02085 |
| | | | 359/569 |
| 10,649,141 | B1 * | 5/2020 | Colburn .............. H01J 37/3056 |
| 10,823,888 | B1 * | 11/2020 | Evans .................. G02B 5/1828 |
| 10,935,799 | B2 * | 3/2021 | Meyer Timmerman Thijssen ...... |
| | | | G02B 5/1819 |
| 10,955,596 | B1 * | 3/2021 | Stone ................... G02B 5/1857 |
| 10,976,483 | B2 * | 4/2021 | Vora ..................... G02B 6/0038 |
| 11,112,694 | B2 * | 9/2021 | LaBonte .............. H01L 21/302 |
| 11,226,441 | B2 * | 1/2022 | Evans .................. G02B 5/1828 |
| 11,372,149 | B2 * | 6/2022 | Meyer Timmerman Thijssen ...... |
| | | | G02B 6/0011 |

(Continued)

FOREIGN PATENT DOCUMENTS

| JP | 2003-014980 A | 1/2003 | |
| JP | 3678872 B2 * | 8/2005 | ............... H01S 5/12 |

(Continued)

OTHER PUBLICATIONS

International Search Report dated Jun. 2, 2021 for Application No. PCT/US2021/016710.

*Primary Examiner* — Martin J Angebrannt
(74) *Attorney, Agent, or Firm* — Patterson + Sheridan, LLP

(57) ABSTRACT

A method for forming a device structure is disclosed. The method of forming a device structure includes forming a variable-depth structure in a device material layer using a laser ablation. A plurality of device structures is formed in the variable-depth structure to define slanted device structures therein. The variable-depth structure and the slanted device structures are formed using an etch process.

12 Claims, 10 Drawing Sheets

(56) References Cited

U.S. PATENT DOCUMENTS

| | | | |
|---|---|---|---|
| 2002/0064345 A1* | 5/2002 | Kikuchi | G02B 6/42 385/39 |
| 2003/0174964 A1* | 9/2003 | Gao | G02B 6/30 385/50 |
| 2007/0175860 A1* | 8/2007 | Liu | G03F 7/0005 438/689 |
| 2009/0202713 A1* | 8/2009 | Pitwon | G02B 6/1223 427/163.2 |
| 2010/0143848 A1 | 6/2010 | Jain et al. | |
| 2014/0358128 A1* | 12/2014 | Montazeri | G02B 6/12002 604/890.1 |
| 2016/0365290 A1* | 12/2016 | Cho | H01L 29/785 |
| 2017/0307834 A1* | 10/2017 | Mathai | G02B 6/4214 |
| 2018/0095201 A1 | 4/2018 | Meili et al. | |
| 2019/0258008 A1* | 8/2019 | Hautala | G02B 27/4272 |
| 2019/0324176 A1* | 10/2019 | Colburn | G03F 7/0035 |
| 2019/0324202 A1* | 10/2019 | Colburn | G02B 27/0172 |
| 2020/0124865 A1* | 4/2020 | Meyer Timmerman Thijssen | G02B 5/1857 |
| 2020/0142120 A1* | 5/2020 | Meyer Timmerman Thijssen | G02B 6/0038 |
| 2020/0144109 A1* | 5/2020 | Meyer Timmerman Thijssen | H01J 37/3171 |
| 2020/0271850 A1* | 8/2020 | Vora | G03F 7/039 |
| 2020/0363719 A1* | 11/2020 | Labonte | H01L 21/302 |
| 2021/0199971 A1* | 7/2021 | Lee | G02B 27/0172 |
| 2021/0294014 A1* | 9/2021 | Evans | G02B 6/0065 |
| 2021/0351069 A1* | 11/2021 | Evans | G03F 7/2051 |

FOREIGN PATENT DOCUMENTS

| | | | | |
|---|---|---|---|---|
| JP | 2009-134287 | * | 6/2009 | |
| JP | 2013-140376 | * | 7/2013 | |
| KR | 2005112380 A | * | 11/2005 | G02B 6/1228 |
| WO | 2019-108379 A1 | | 6/2019 | |

* cited by examiner

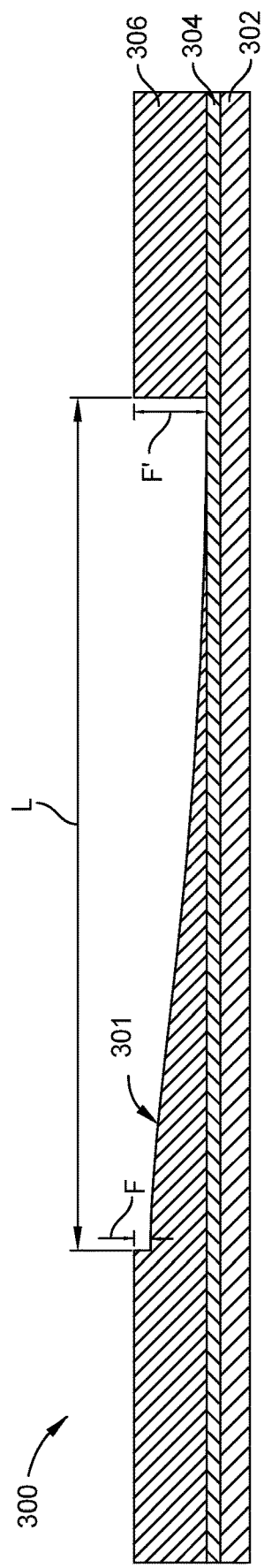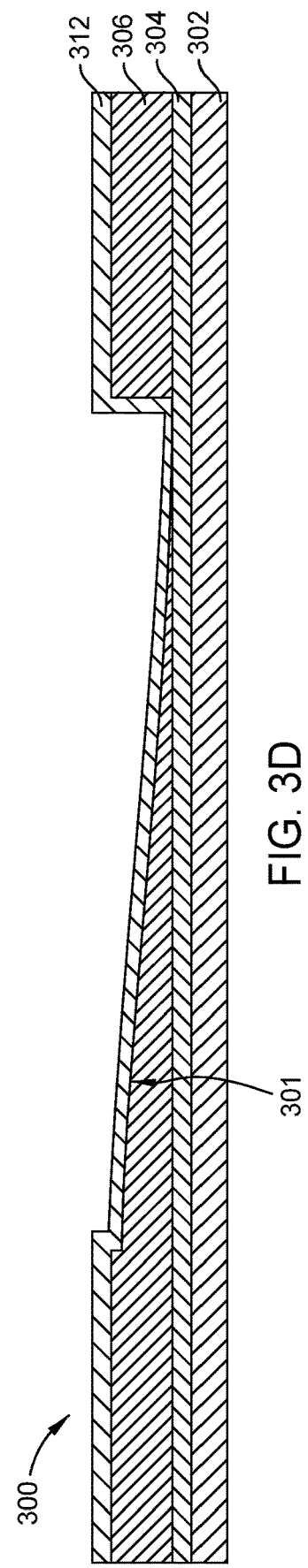

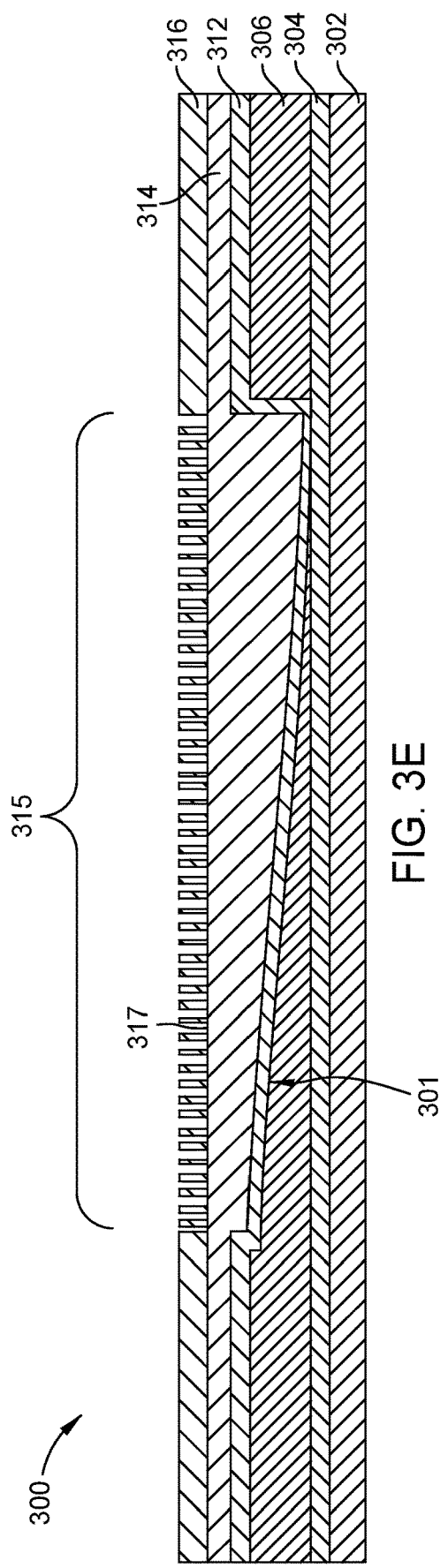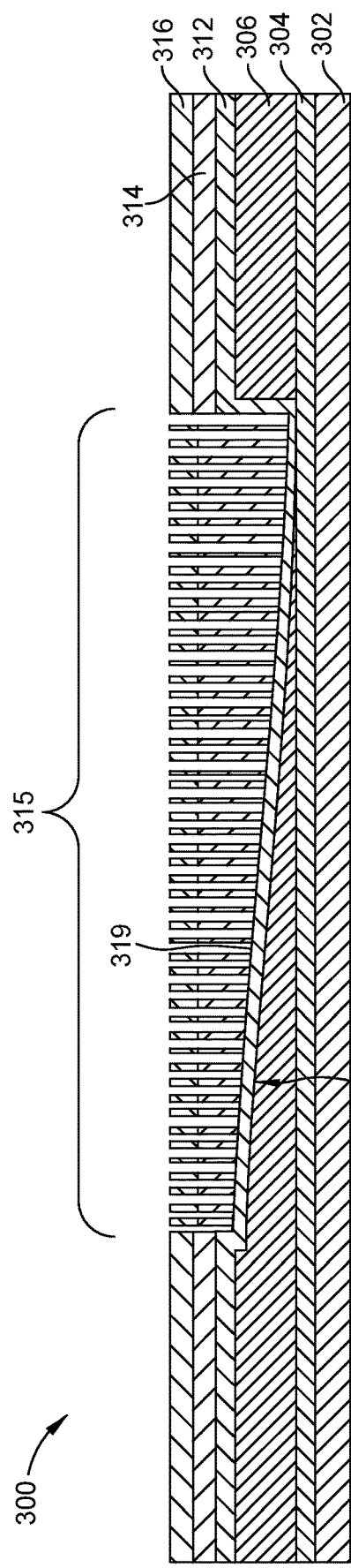

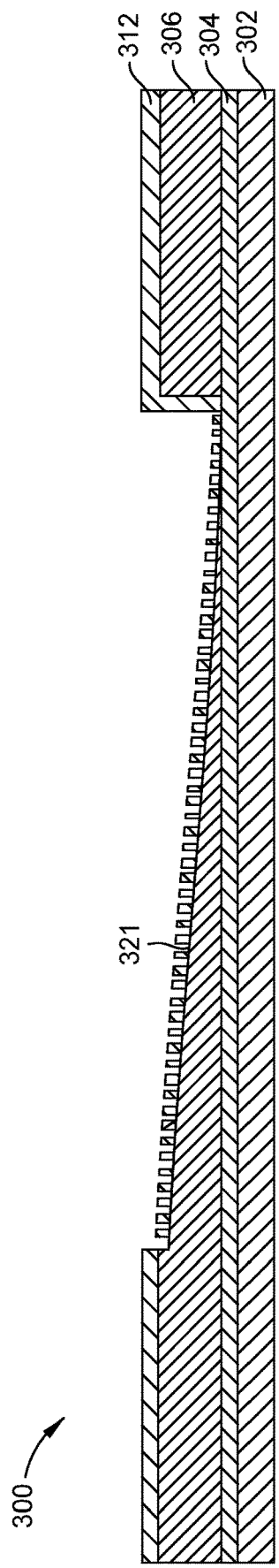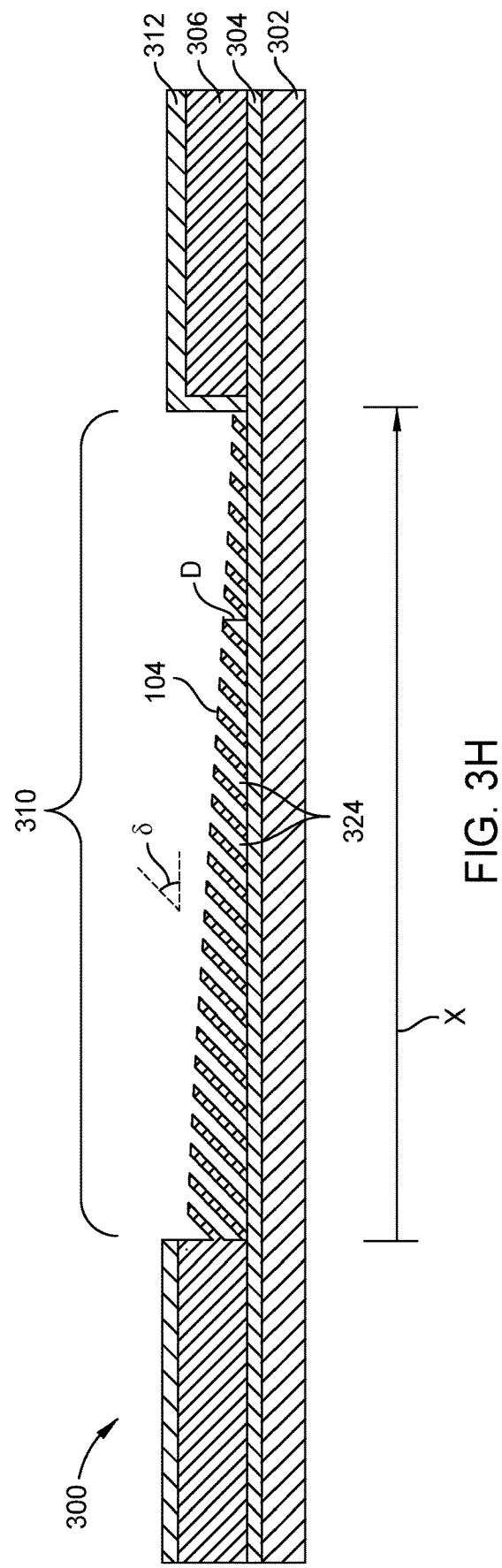
FIG. 3G
FIG. 3H

FORMING VARIABLE DEPTH STRUCTURES WITH LASER ABLATION

BACKGROUND

Field

Embodiments of the present disclosure generally relate to optical devices for augmented, virtual, and mixed reality. More specifically, embodiments described herein provide forming depth-modulated device structures of optical devices.

Description of the Related Art

Virtual reality is generally considered to be a computer-generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device, or handheld device, to view the surrounding environment, yet also see images of virtual objects that are generated in the display and appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

One such challenge is displaying a virtual image overlayed on an ambient environment. Optical devices are used to assist in overlaying images. Generated light is propagated through a waveguide until the light exits the waveguide and is overlayed on the ambient environment. Fabricating optical devices can be challenging as optical devices tend to have non-uniform properties. Accordingly, improved methods of fabricating optical devices are needed in the art.

SUMMARY

The present disclosure generally relates to a method for forming a device structure for use in a display apparatus or in other applications. More specifically, the disclosure relates to a variable depth structure for use in the device structure using created using laser ablation. The method herein may also form a device structure that is used as a master for nano-imprint lithography.

In one embodiment, a method of forming a device structure is provided. The method includes forming a variable-depth structure in a device material layer using laser ablation. The method also includes forming a hardmask and a photoresist stack over the device material layer. The method further includes etching the photoresist stack. The method also includes forming a plurality of device structures in the device material layer.

In another embodiment, a method of forming a device structure is provided. The method includes forming a device material layer on a substrate and forming a variable-depth structure in the device material layer using laser ablation. The method also includes forming a hardmask and a photoresist stack over the device material layer. The method further includes etching the photoresist stack and forming a plurality of device structures in the device material layer.

In yet another embodiment, a method of forming a device structure is provided. The method includes forming a device material layer on a substrate and forming a sacrificial layer on the device material layer. The method further includes forming a variable-depth structure in the sacrificial layer using laser ablation. The method also includes forming a hardmask and a photoresist stack over the device material layer. The method further includes etching the photoresist stack and forming a plurality of device structures in the device material layer.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 3A-3H are schematic, cross-sectional views of a portion of a variable-depth structure according to an embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to methods of forming a device structure having variable-depth slanted device structures. To accomplish this, a method includes forming a variable-depth structure in a device material layer using laser ablation. A plurality of channels is formed in the variable-depth structure to define slanted device structures therein. The variable-depth structure is formed using laser ablation and the slanted device structures are formed using a selective etch process. The method described herein can also be used to create a device structure that functions as a master for nanoimprint lithography.

Figure 1:
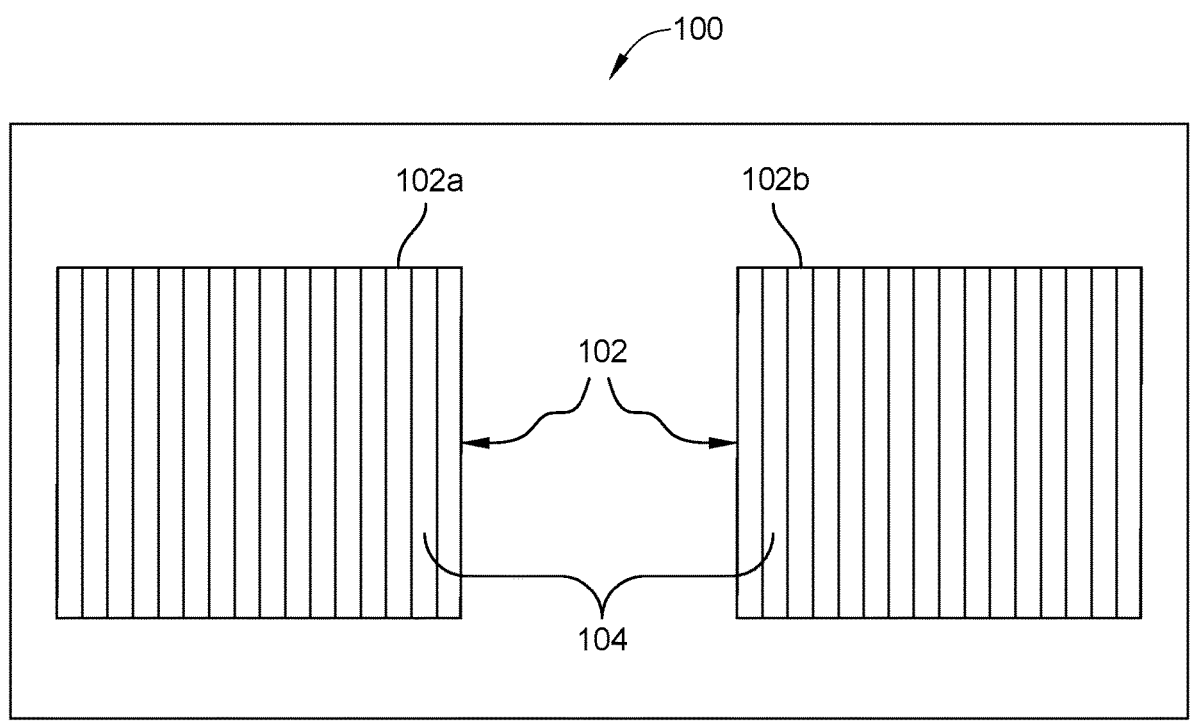
FIG. 1 is a front view of an optical device according to an embodiment.

FIG. 1 is a front view of an optical device 100. It is to be understood that the optical device 100 described below is an exemplary optical device. In one embodiment, the optical device 100 is a waveguide combiner, such as an augmented reality waveguide combiner. In another embodiment, the optical device 100 is a flat optical device, such as a metasurface. The optical device 100 includes a plurality of device structures 104. The device structures 104 may be nanostructures having sub-micro dimensions, e.g., nano-sized dimensions, such as critical dimensions less than 1 μm. In one embodiment, regions of the device structures 104 correspond to one or more gratings 102, such as the grating areas 102*a* and 102*b*. In one embodiment, the optical device 100 includes a first grating area 102*a* and a second grating area 102*b* and each of the first grating area 102*a* and 102*b* each contain a plurality of device structures 104.

The depth of the gratings 102 may vary across the grating areas 102*a* and 102*b* in embodiments described herein. In some embodiments, the depth of the gratings 102 may vary smoothly over the first grating area 102*a* and over the second grating area 102*b*. In one example embodiment, the depth may range from about 10 nm to about 400 nm across one of the grating areas. The grating area 102*a*, in an example embodiment, can range from approximately 20 mm to approximately 50 mm on a given side. Therefore, as one example, the angle of the change in the depth of the gratings 102 may be on the order of 0.0005 degrees.

In embodiments described herein, the device structures 104 may be created using laser ablation. Laser ablation, as used herein, is used to create three-dimensional microstructures in the device material, or optionally to create a variable-depth structure in a sacrificial layer overlaying the device material as part of a variable-depth structure process. Using laser ablation to create the optical structures 104 allows for fewer processing operations and higher variable-depth resolution than existing methods.

Figure 2:
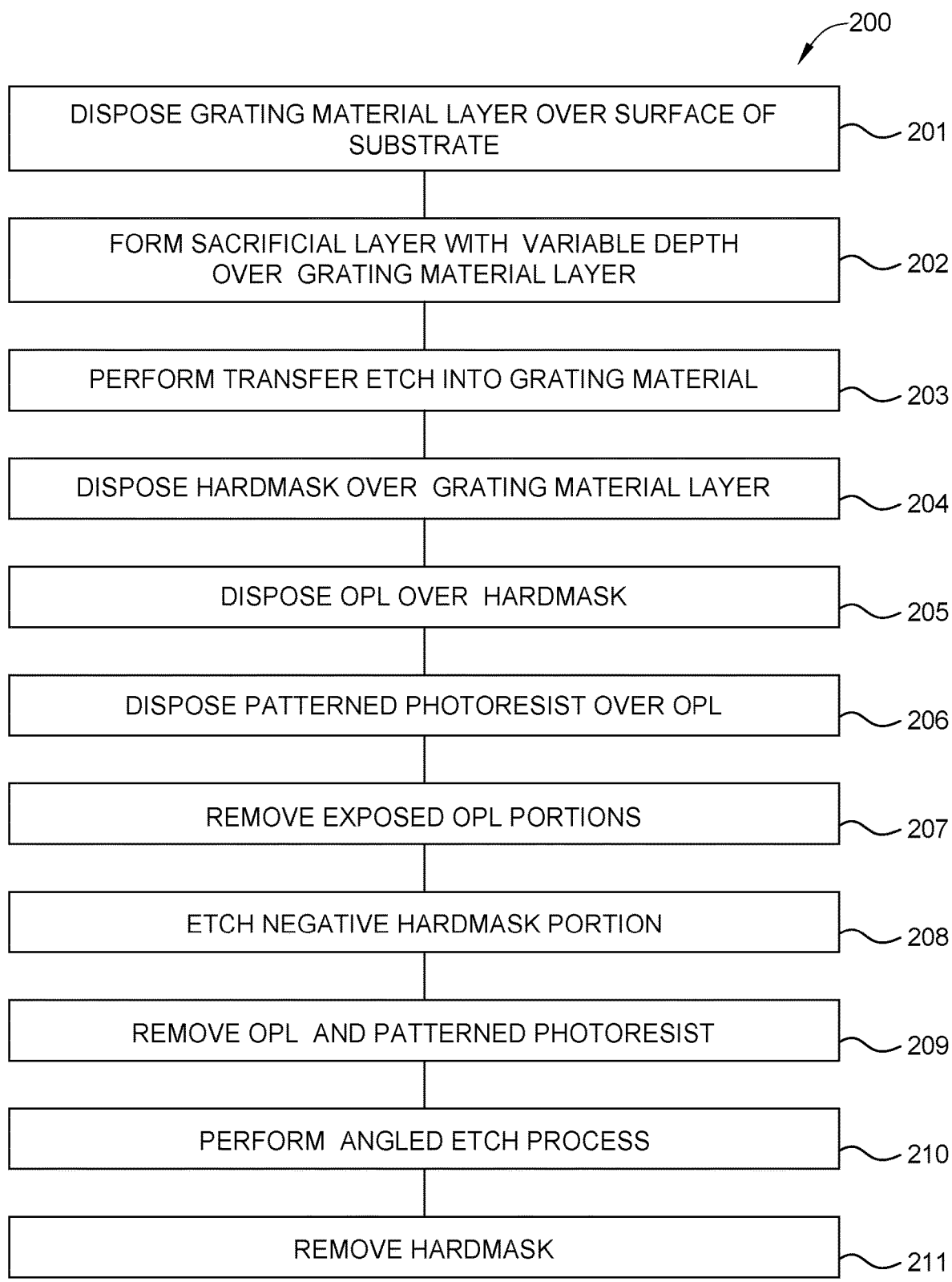
FIG. 2 is a flow diagram of a method for forming a device structure according to an embodiment.
Figure 3A:
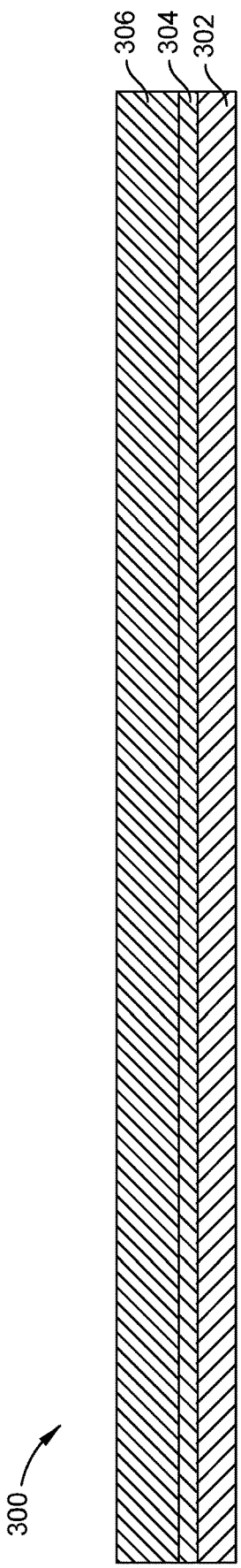

FIG. 2 is a flow diagram of a method 200 for forming a portion of optical device 300, shown in FIGS. 3A-3H, having variable-depth structures, which corresponds with grating area 102*a* or 102*b*. At operation 201, a device material layer 306 is disposed over a surface of a substrate 302 as shown in FIG. 3A. The substrate 302 may be formed from any suitable material, provided that the substrate 302 can adequately transmit light in a desired wavelength or wavelength range and can serve as an adequate support for the portion of optical device 300. In some embodiments, which can be combined with other embodiments described herein, the material of substrate 302, includes, but is not limited to, one or more silicon (Si), silicon dioxide ($SiO_2$), or sapphire containing materials. In other embodiments, which can be combined with other embodiments described herein, the material of substrate 302 includes, but is not limited to, materials having a refractive index between about 1.7 and about 2.0.

The device material layer 306 may be disposed over the surface of the substrate 302 by one or more (PVD), chemical vapor deposition (CVD), plasma-enhanced (PECVD), flowable CVD (FCVD), atomic layer deposition (ALD), or spin-on processes. In one embodiment, which can be combined with other embodiments described herein, the device material of device material layer 306 is selected based on the modulated depth and slant angle of each of the plurality of device structures 104 of the portion of optical device 300 and the refractive index of the substrate 302. In some embodiments, which can be combined with other embodiments described herein, the device material layer 306 includes, but is not limited to, one or more silicon nitride (SiN), silicon oxycarbide (SiOC), titanium dioxide ($TiO_2$), silicon dioxide ($SiO_2$), vanadium (IV) oxide (VOx), aluminum oxide ($Al_2O_3$), indium tin oxide (ITO), zinc oxide (ZnO), tantalum pentoxide ($Ta_2O_5$), silicon nitride ($Si_3N_4$), zirconium dioxide ($ZrO_2$), or silicon carbon-nitride (SiCN) containing materials. In some embodiments, which can be combined with other embodiments described herein, the device material of the device material layer 306 may have a refractive index between about 1.5 and about 2.65. In other embodiments, which can be combined with other embodiments described herein, the device material of the device material layer 306 may have a refractive index between about 3.5 and about 4.0

In some embodiments, which can be combined with other embodiments described herein, an etch stop layer 304 may be optionally disposed on the surface of the substrate 302 between the substrate 302 and the device material layer 306. The etch stop layer 304 may be disposed by one or more PVD, CVD, PECVD, FCVD, ALD, or spin-on processes. The etch stop layer 304 may be formed from any suitable material, for example titanium nitride (TiN) or tantalum nitride (TaN), among others, provided that the etch stop layer 304 is resistant to the etching processes described herein. In one embodiment, which can be combined with other embodiments described herein, the etch stop layer 304 is a non-transparent etch stop layer that is removed after the device structure 104 is formed. In another embodiment, the etch stop layer 304 is a transparent etch stop layer.

Figure 3B:
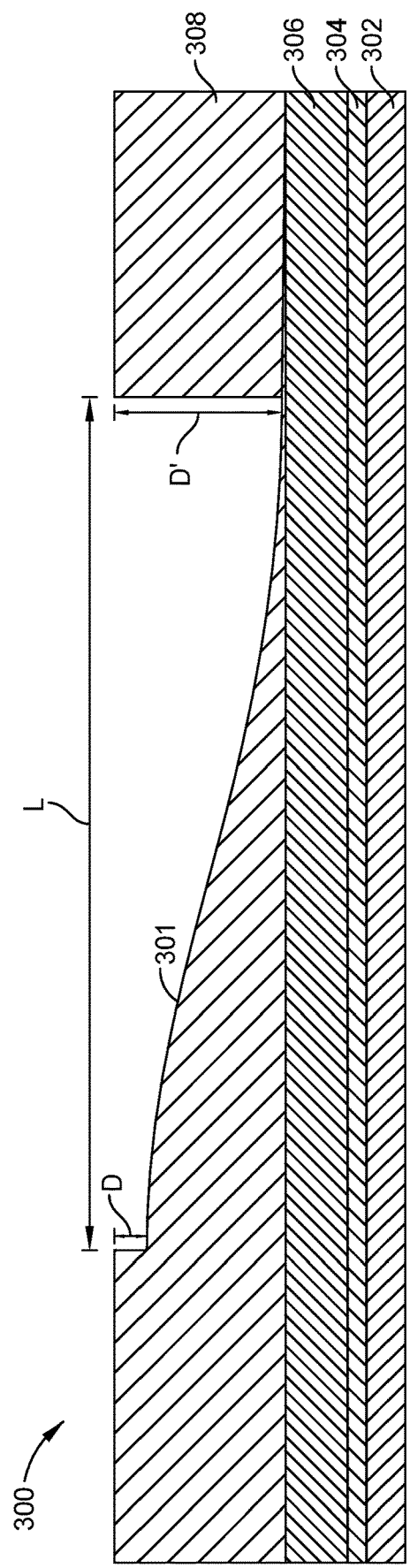

At operation 202, a sacrificial layer 308 is formed over the device material layer 306, as shown in FIG. 3B. In one embodiment, the sacrificial layer 308 is a SiN layer, SiOx layer or photoresist layer. In one embodiment, forming the sacrificial layer 308 includes disposing a resist material over the device material layer 306 and developing the resist material utilizing a lithography process. The resist material may include but is not limited to, light-sensitive polymer containing materials. Developing the resist material may include performing a lithography process, such as photolithography, digital lithography and/or laser ablation. In this embodiment, laser ablation is performed on the sacrificial layer 308 to create a shape of a variable-depth structure 301 within the sacrificial layer 308 over a length L with a depth of D on the left side and a depth of D' on the right side. As described above, any desired one-, two-, or three-dimensional shape can be created in the sacrificial layer 308 using laser ablation. Laser ablation uses variable pulse repetition of a laser beam scanned across an area to be ablated. One benefit of laser ablation over other variable-depth process, such as gray-tone resist processes, is that laser ablation is a physical process as opposed to the chemical process using a gray-tone resist which can have a limited shelf life. Laser ablation also results in faster throughput and faster changes to the variable-depth structure without the need for masks. Laser ablation also results in increased spacial fidelity or resolution over typical etch processes.

In this embodiment, at operation 203, a transfer etch process is then performed on the variable-depth structure 301 of the sacrificial layer 308 to form the variable-depth structure 301 within the device material layer 306. The results of operation 203 are illustrated in FIG. 3C. In this embodiment, the transfer etch process removes the sacrificial layer 308 and etches the underlying device material layer 306 to produce the variable-depth structure 301 within the device material layer 306.

The variable-depth structure 301 in this embodiment has a length L between a first end and a second end. The first end of the variable-depth structure 301 has a depth F and the second end has a depth F'. That is, the depth of the variable-depth structure 301 is minimal at the first end and maximum at the second end in this embodiment. The depth from F to F' generally is within a range of about 0 nm to about 700 nm. In this embodiment, the length L is substantially large compared to the depths F and F'. For example, the length L may be about 25 mm while the depth F at the first end is about 0 nm to about 50 nm and the depth F' at the second end is about 250 nm to about 700 nm. Accordingly, the variable-depth structure 301 has a substantially shallow slope. In this example, the angle of the slope is less than 1 degree, such as less than 0.1 degrees, like about 0.0005 degrees. The slope of the variable-depth structure 301 is illustrated herein with an exaggerated angle for clarity.

In one embodiment, which can combined with other embodiments, where the device design process does not require the deposition of a sacrificial layer 308 as described above, laser ablation may be performed directly on the device material layer 306 to form the variable-depth structure 301. Laser ablation is performed to create the shape of the variable-depth structure 301 over the length L with a depth of F on the left side and a depth of F' on the right side. In one embodiment, the shape of the variable-depth structure 301 over length L is in the shape of a wedge with varying levels of depth. The shape of the variable-depth structure 301 determines the modulation of the depth D of device structure 104 across the substrate 302, as shown in FIG. 3H.

At operation 204, a hardmask 312 is disposed over the device material layer 306 and variable-depth structure 301. The results of operation 204 are illustrated in FIG. 3D. The hardmask 312 may be disposed over the device material layer 306 by one or more liquid material pour casting, spin-on coating, liquid spray coating, dry powder coating, screen printing, doctor blading, PVD, CVD, PECVD, FCVD, ALD, evaporation, or sputtering processes. In one embodiment, which can be combined with other embodiments described herein, the hardmask 312 is non-transparent and is removed after the portion of optical device 300 is formed. In another embodiment, the hardmask 312 is transparent. In some embodiments, which can be combined with other embodiments described herein, the hardmask 312 includes, but is limited to, chromium (Cr), silver (Ag), $Si_3N_4$, $SiO_2$, TiN, or carbon (C) containing materials. The hardmask 312 can be deposited so that the thickness of the hardmask 312 is substantially uniform. In yet other embodiments, the hardmask 312 can be deposited so that the thickness varies from about 30 nm and about 50 nm at varying points on the device material layer 306. The hardmask 312 is deposited in such a way that the slope of the hardmask 312 is similar to the slope of the variable-depth structure 301.

At operation 205, an organic planarization layer 314 is disposed over the hardmask 312. The results of operation 205 are illustrated in FIG. 3E. The organic planarization layer 314 may include a photo-sensitive organic polymer comprising a light-sensitive material that, when exposed to electromagnetic (EM) radiation, is chemically altered and thus configured to be removed using a developing solvent. The organic planarization layer 314 may include any organic polymer and a photo-active compound having a molecular structure that can attach to the molecular structure of the organic polymer. In one embodiment, which can be combined with other embodiments described herein, the organic planarization layer 314 may be disposed using a spin-on coating process. In another embodiment, which can be combined with other embodiments described herein, the organic planarization layer 314 may include, but is not limited to, one or more of polyacrylate resin, epoxy resin, phenol resin, polyamide resin, polyimide resin, unsaturated polyester resin, polyphenylenether resin, polyphenylenesulfide resin, or benzocyclobutene (BCB).

As shown in FIG. 3E, the optical planarization layer 314 varies in thickness, such that a substantially planar top surface is formed. The optical planarization layer 314 varies in thickness, such that the space between the sloped conformal hardmask 312 and the substantially planar top surface of the optical planarization layer 314 is completely filled and has a varying thickness over the sloped wedge shaped-structure 301.

Referring to FIGS. 3E-3H, at operation 206, a patterned photoresist 316 is disposed over the organic planarization layer 314. The patterned photoresist 316 is formed by disposing a photoresist material on the organic planarization layer 314 and developing the photoresist material. The patterned photoresist 316 defines a hardmask pattern 315, shown in FIG. 3E that corresponds to exposed segments 321 of the device material layer 306, as shown in FIG. 3G. The hardmask pattern 315 functions as a pattern guide for formation of slanted device structures 104. The exposed segments 321, as shown in FIG. 3G, of the device material layer 306 to be etched correspond to gaps 324 between the device structures 104, as shown in FIG. 3H. In one embodiment, which can be combined with other embodiments described herein, the photoresist material may be disposed on the organic planarization layer 314 using a spin-on coating process. In another embodiment, which can be combined with other embodiments described herein, the patterned photoresist 316 may include, but is not limited to, light-sensitive polymer containing materials. Developing the photoresist material may include performing a lithography process, such as photolithography and/or digital lithography.

At operation 207, organic planarization layer portions 317 of the organic planarization layer 314 exposed by the resist pattern 315 are removed. Removing the organic planarization layer portions 317 exposes negative hardmask portions 319 of the hardmask pattern 315 that correspond to the gaps 324 between the device structures 104. The organic planarization layer portions 317 may be removed by IBE, RIE, directional RIE, plasma etching, wet etching, and/or lithography. The results of operation 207 are shown in FIG. 3F.

At operation 208, the negative hardmask portions 319 of the hardmask pattern 315 are etched. The results of operation 208 are shown in FIG. 3F. Etching the negative hardmask portions 319 exposes the exposed segments 321 of the device material layer 306 corresponding to the hardmask pattern 315. In one embodiment, which can be combined with other embodiments described herein, etching the negative hardmask portions 319 may include, but is not limited to, at least one of IBE, RIE, directional RIE, or plasma etching.

At operation 209, the patterned photoresist 316 and the organic planarization layer 314 are removed. The results of operation 208 are illustrated in FIG. 3G. Stripping the organic planarization layer 314 and the patterned photoresist layer 316 yields a set of negative hardmask portions 319.

At operation 210, an etch process is performed. In one embodiment, which can be combined with other embodiments described herein, an angled etching process is performed. The angled etch process may include, but is not limited to, at least one of IBE, RIE, or directional RIE. The ion beam generated by IBE may include, but is not limited to, at least one of a ribbon beam, a spot beam, or a full substrate-size beam. Performing the angled etch process etches the exposed segments 321 of the device material layer 306 to form a plurality of device structures 104. As shown in FIG. 3H, the angled etching process forms the plurality of device structures 104 such that the device structures 104 have a slant angle $\theta$ relative to the surface of the substrate 302. In one embodiment, which can be combined with other embodiments described herein, the slant angle $\theta$ of each of the device structures 104 is substantially the same. In another embodiment, which can be combined with other embodiments described herein, the slant angle ϑ of at least one device structure of the plurality of device structures 104 is different.

The device structure pattern 310 provides for a depth D of the device structures 104 to have gradient modulated across the substrate 302. For example, as shown in FIG. 3H, the depth D of the device structures 104 decreases in the X-direction across the substrate 302. In one embodiment, which can be combined with other embodiments described herein, the gradient of the depth D of the device structures 104 is continuous. In one embodiment, which can be combined with other embodiments described herein, the gradient of the depth D of the device structures 104 is step-wise. As described above, modulating the depth D of the device structures 104 provides for control of the in-coupling and out-coupling of light by the gratings 102 of the optical device 100.

At operation 211, an optional operation may be performed to strip the hardmask 312. A wet clean may be performed in some embodiments.

Figure 4A:
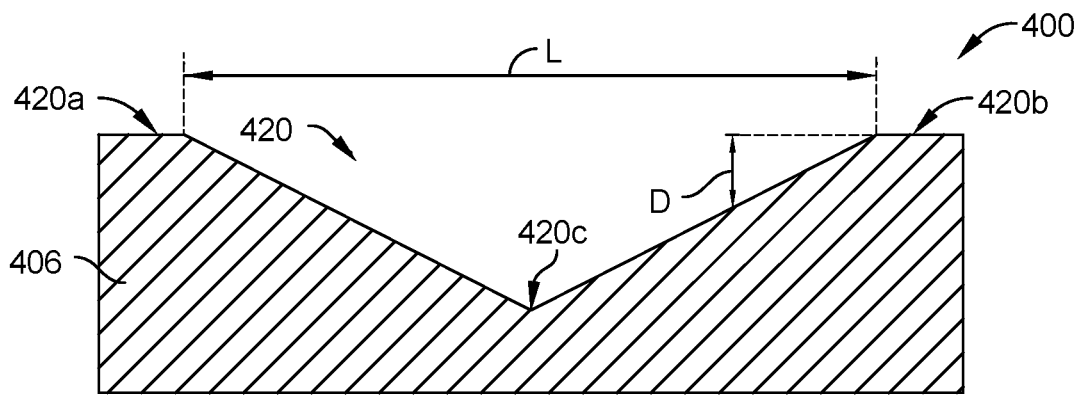
FIGS. 4A-4C are cross-sectional enlargements of examples of shapes of a variable-depth structure.
Figure 4B:
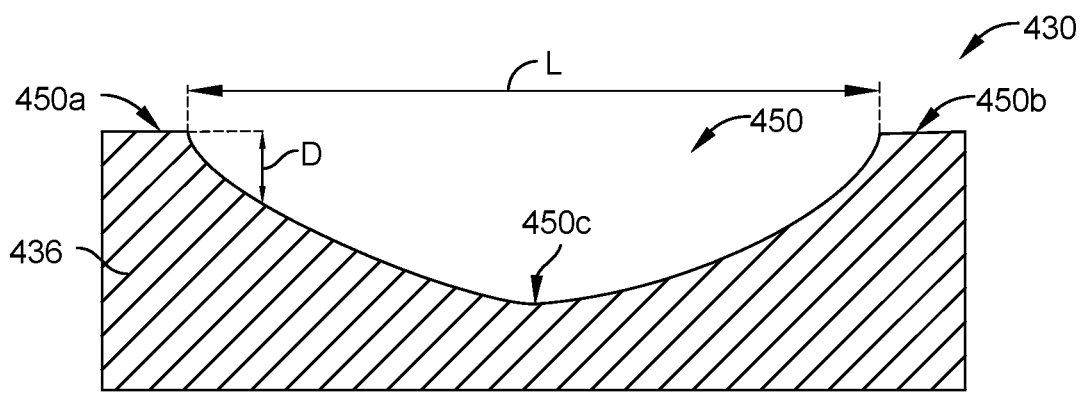
Figure 4C:
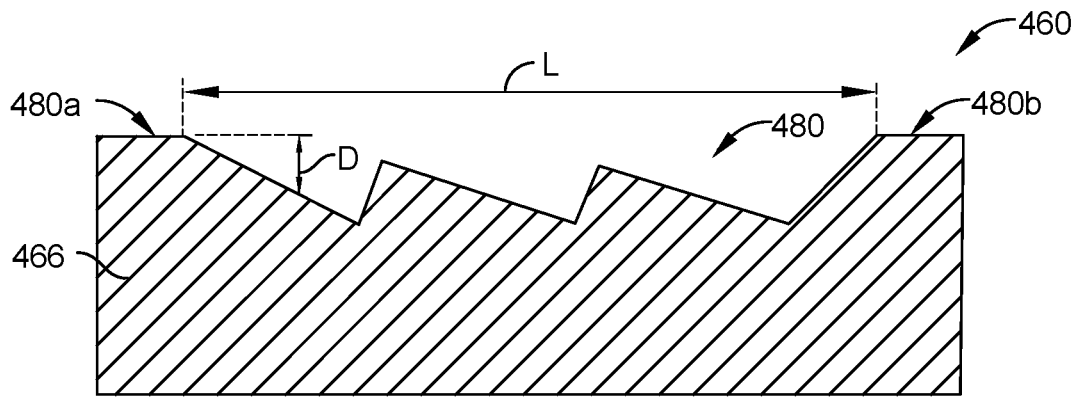

The laser ablation process described herein advantageously allows the variable-depth structure to have a slope and/or curvature in one or more directions. FIGS. 4A-4C illustrate other examples of shapes that can be used for the variable-depth structure. FIG. 4A illustrates a variable-depth structure 420 in a device material layer 406 of a portion of optical device 400. The variable-depth structure 420 has two planar sloped portions which extend from respective peripheral regions 420a, 420b towards a central region 420c. FIG. 4B illustrates a variable-depth structure 450 in a device material layer 436 of a portion of optical device 430. The variable-depth structure 450 is a curved structure which has a shallow depth D at peripheral regions 450a, 450b and an increased depth at a central region 450c. In one example, the variable-depth structure 450 has a parabolic shape. The depth D increases non-linearly from the peripheral regions 450a, 450b to the central region 450c. FIG. 4C illustrates a variable-depth structure 480 in a device material layer 466 of a portion of optical device 460. The variable-depth structure 480 has a depth D that oscillates from a first end 480a to a second end 480b which forms a pattern of cyclical depths D for the variable-depth structure 480. The variable-depth structure 480 is shown with linear, saw-tooth oscillations of the depth D. However, it is contemplated that the depth D can vary non-linearly so that the variable-depth structure has wave-like oscillations in the depth D. The depth D of a variable-depth structure, such as wedge-shapes structures 420, 450, 480 can change linearly or non-linearly across a length L thereof from a first end (i.e, 420a, 450a, 480a) to a second end (i.e., 420b, 450b, 480b). Utilizing grayscale lithography, laser ablation and the techniques described herein, variable-depth structures of varying shapes can be patterned with a single pass instead of multiple operations as required by prior techniques.

Figure 5A:
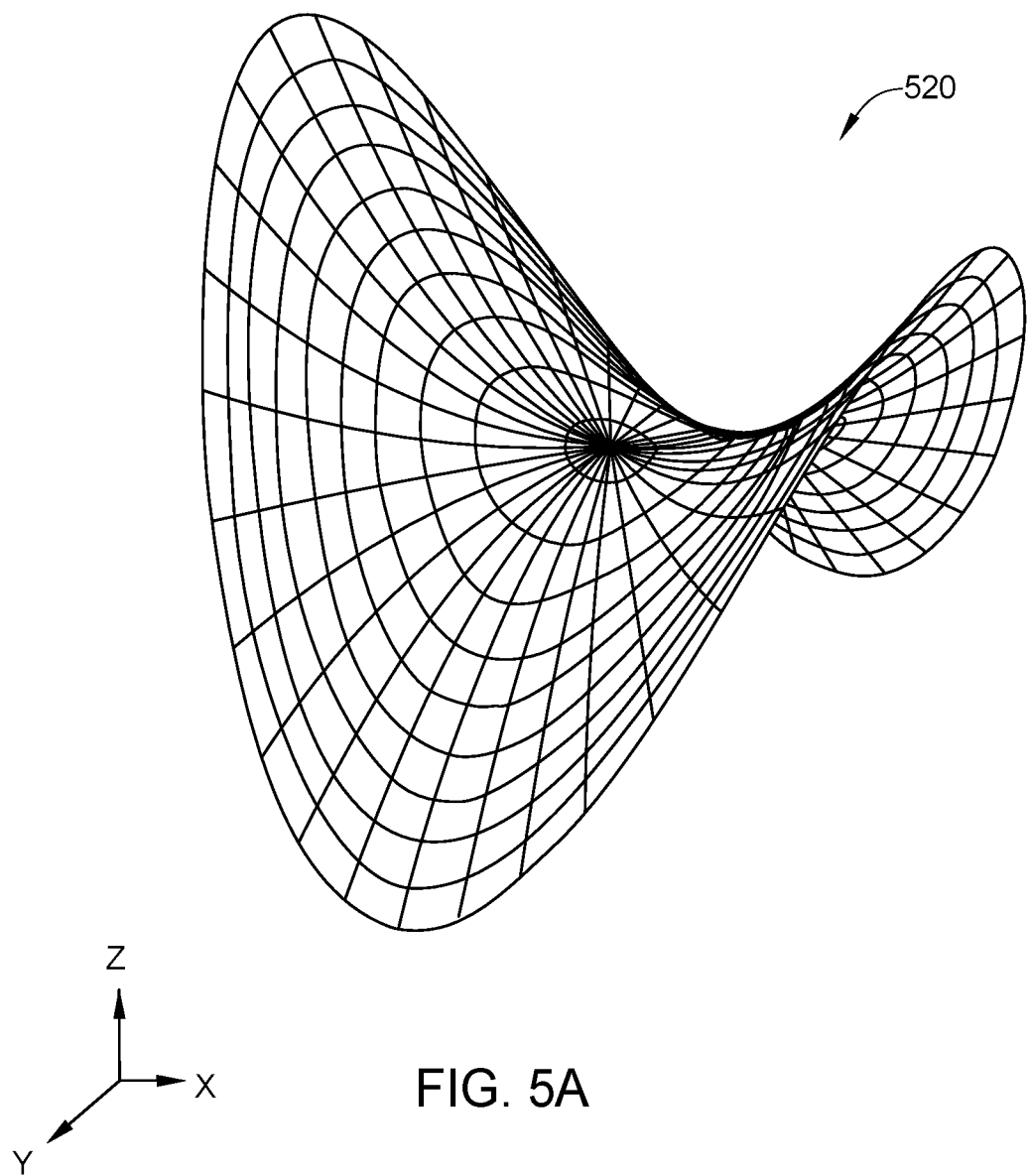
FIGS. 5A-5C are perspective views of examples of three dimensional shapes of a variable-depth structure.
Figure 5B:
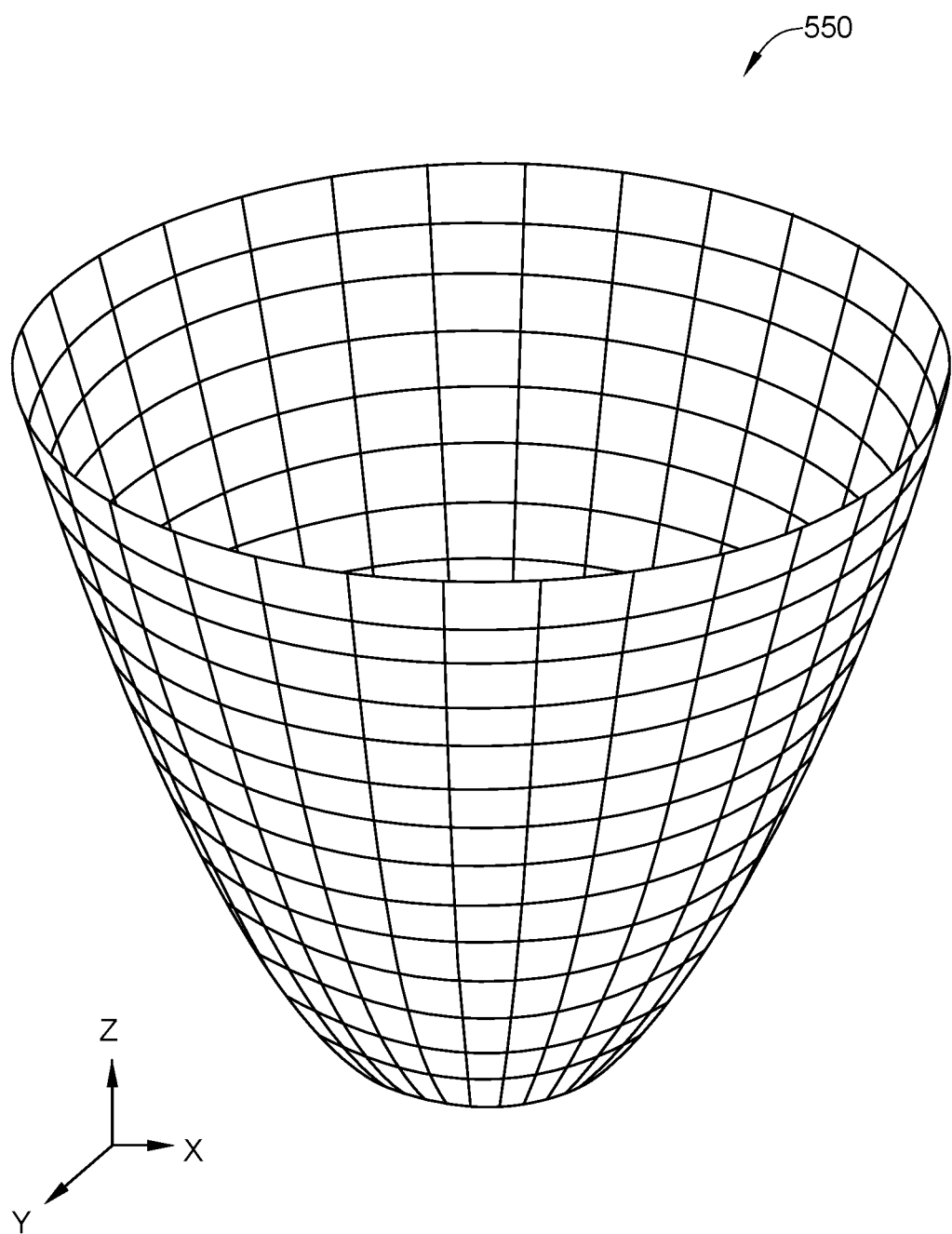
Figure 5C:
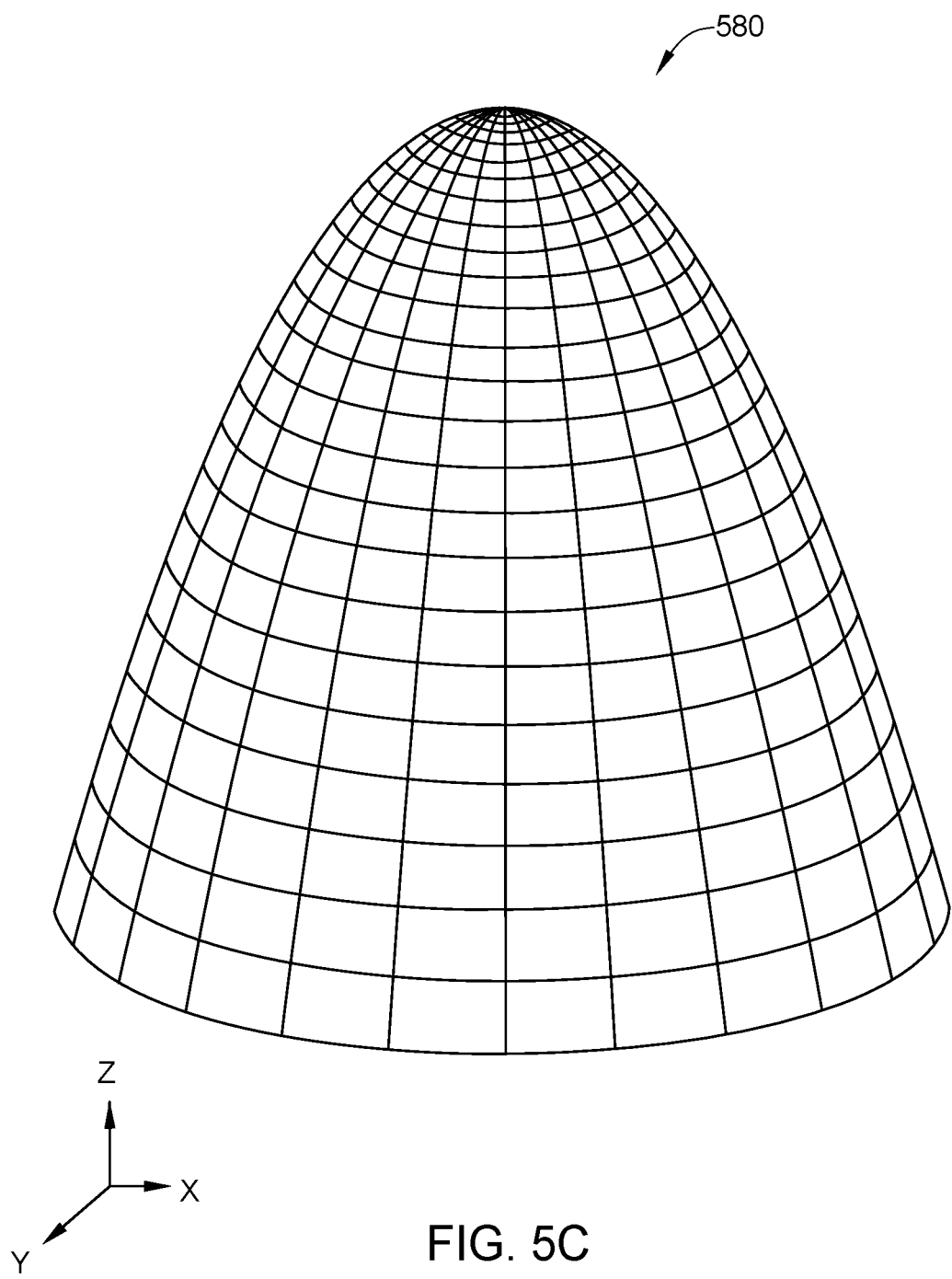

In another example, the variable-depth structure has a three dimensional shape. That is, the depth changes in multiple directions (i.e., a first direction X and a second direction Y) as illustrated in the examples of FIGS. 5A-5C. FIG. 5A illustrates a variable-depth structure 520 which has a saddle-point shaped curvature (i.e., hyperbolic paraboloid shape). FIG. 5B illustrates a variable-depth structure 550 which has an elliptic paraboloid shape with positive curvature. FIG. 5C illustrates a variable-depth structure 580 which has an elliptic paraboloid shape with negative curvature. The three dimensional shape of the variable-depth structure is not limited to the examples of FIGS. 5A-5C. Other desired shapes, for example a paraboloid in a square domain with positive curvature or negative curvature, an ellipsoid, and linear sloped shapes, among others, are also contemplated and can be used herewith. In these cases, the depth of the variable-depth structure changes in both the X and Y directions. Thus, upper surfaces of the slanted device structures are curved as defined by the shape of the curvature of the variable-depth structure.

In summation, methods for forming a device structure having variable-depth slanted device structures are described herein. The methods include forming a depth-modulated variable-depth structure in a device material layer using laser ablation. A plurality of device structures are formed in the variable-depth structure to define slanted device structures therein. The variable-depth structure is formed using laser ablation, and the slanted device structures are formed using an etch process. The method described herein can also be used to create a device structure that functions as a master for nanoimprint lithography.

What is claimed is:

1. A method of forming a device structure comprising:
   forming a device material layer on a substrate;
   forming a variable-depth structure in the device material layer using laser ablation;
   forming a hardmask and a photoresist stack over the device material layer, wherein the photoresist stack comprises an optical planarization layer and a photoresist layer, wherein the photoresist layer is in direct contact with the optical planarization layer;
   etching the photoresist stack;
   etching the hardmask; and
   forming a plurality of device structures in the device material layer by etching through the device material layer.

2. The method of claim 1, wherein the variable-depth structure changes in depth from a first end to a second end.

3. The method of claim 2, wherein the depth of the variable-depth structure changes linearly from the first end to the second end.

4. The method of claim 2, wherein the depth of the variable-depth structure changes non-linearly from the first end to the second end.

5. The method of claim 2, wherein the depth of the variable-depth structure oscillates from the first end to the second end.

6. A method of forming a device structure comprising:
   forming a device material layer on a substrate;
   forming a sacrificial layer on the device material layer;
   forming a variable-depth structure in the sacrificial layer using laser ablation;
   forming a hardmask and a photoresist stack over the sacrificial layer, wherein the photoresist stack comprises an optical planarization layer and a photoresist layer, wherein the photoresist layer is in direct contact with the optical planarization layer;
   etching the photoresist stack;
   etching the hardmask; and
   forming a plurality of device structures in the device material layer by etching through the device material layer.

7. The method of claim 6, wherein the variable-depth structure changes in depth from a first end to a second end.

8. The method of claim 6, wherein the depth of the variable-depth structure changes linearly from the first end to the second end.

9. The method of claim 6, wherein the depth of the variable-depth structure changes non-linearly from the first end to the second end.

10. The method of claim 6, wherein the depth of the variable-depth structure oscillates from the first end to the second end.

11. The method of claim 10, wherein the etching of the sacrificial layer and the device material layer results in the transfer of the variable-depth structure into the device material layer.

12. The method of claim 6, further comprising;
etching the sacrificial layer and the device material layer.

* * * * *